US007816938B2

(12) United States Patent
Lee et al.

(10) Patent No.: US 7,816,938 B2
(45) Date of Patent: Oct. 19, 2010

(54) DISPLAY APPARATUS AND ENABLE CIRCUIT THEREOF

(75) Inventors: Kuo-Sheng Lee, Yongkang (TW); Chi-Wen Chen, Minsyong Town, Chiayi County (TW)

(73) Assignee: Au Optronics Corp., Hsinchu (TW)

( * ) Notice: Subject to any disclaimer, the term of this patent is extended or adjusted under 35 U.S.C. 154(b) by 777 days.

(21) Appl. No.: 11/617,086

(22) Filed: Dec. 28, 2006

(65) Prior Publication Data

US 2008/0035922 A1 Feb. 14, 2008

(30) Foreign Application Priority Data

Aug. 10, 2006 (TW) .............................. 95129359 A

(51) Int. Cl.
*G01R 31/00* (2006.01)

(52) U.S. Cl. ...................................... 324/770; 324/765

(58) Field of Classification Search ................ 324/765, 324/770, 158.1

See application file for complete search history.

(56) References Cited

U.S. PATENT DOCUMENTS 5,929,695 A * 7/1999 Chan et al. .................. 327/537
6,956,396 B2 * 10/2005 Lai et al. .................... 324/770
7,088,092 B2 * 8/2006 Ostertag .................. 324/158.1
2004/0201399 A1 * 10/2004 Sher et al. .................. 324/765
2005/0057273 A1 * 3/2005 Lin et al. .................... 324/770
2005/0253824 A1 * 11/2005 Lin ............................ 345/204
2007/0146003 A1 * 6/2007 Hayafuji ..................... 324/770

* cited by examiner

*Primary Examiner*—Ha Tran T Nguyen
*Assistant Examiner*—Arleen M Vazquez
(74) *Attorney, Agent, or Firm*—Thomas, Kayden, Horstemeyer & Risley, LLP

(57) ABSTRACT

A display apparatus comprises a display array and an enable circuit. The enable circuit comprises a set of diodes and a set of transistors. The diode element comprises a first contact and a second contact. The set of transistors comprises a first contact, a second contact, and a third contact. The first contact of the set of transistors is connected to the display array. The second contact of the set of transistors receives a test signal to test the display array. The third contact of the set of transistors is connected to the first contact of the diode element. The second contact of the diode element receives an enable signal to activate the enable circuit.

28 Claims, 3 Drawing Sheets

DISPLAY APPARATUS AND ENABLE CIRCUIT THEREOF

This application claims the benefits of Taiwan Patent Application No. 095129359 filed, Aug. 10, 2006, the contents of which are herein incorporated by reference in its entirety.

BACKGROUND OF THE INVENTION

1. Field of the Invention

The present invention relates to a display apparatus and an enable circuit for activating a test on a circuit in the display apparatus.

2. Descriptions of the Related Art

In recent years, the development of flat panel displays progresses more and more rapidly as having gradually taken the place of traditional cathode ray tube displays. Current flat panel displays mainly include several types as follows: organic electro-luminescence device (OELD), plasma display panel (PDP), liquid crystal display (LCD), and field emission display (FED). No matter what it is the flat panel display listed above, the display array circuit thereof has to undergo a test during manufacturing to determine whether the manufactured flat panel display can function normally or not.

FIG. 1 is a schematic diagram illustrating a test of the prior art on a flat panel display. The flat panel display comprises peripheral circuits 101, a display array 103, and test signal input terminals 105. The display array 103 comprises a plurality of electrode wirings. The peripheral circuits 101 are used to drive the electrode wirings. The test signal input terminals 105 are electrically connected to the display array 103 to input test signals to the electrode wirings to test the display array 103 of the flat panel display.

After the test on the flat panel display is finished, a cutoff procedure would be carried out to cut off the electrical connections between the test signal input terminals 105 and the display array 103 so as to avoid the influence of the test signal input terminals 105 on the normal operation of the flat panel display. However, this cutoff procedure would increase the time and cost required for the production of the flat panel display. Therefore, it is an objective in testing the flat panel display to decrease the time and cost brought by this cutoff procedure.

SUMMARY OF THE INVENTION

An objective of the present invention is to provide an enable circuit for activating a test on a circuit according to an enable signal. The enable circuit comprises a diode element and a set of transistors. The diode element comprises a first contact and a second contact. The set of transistors comprises a first contact, a second contact, and a third contact. The first contact of the set of transistors is connected to the circuit. The second contact of the set of transistors receives a test signal to test the circuit. The third contact of the set of transistors is connected to the first contact of the diode element. The second contact of the diode element receives the enable signal to activate the test on the circuit.

Another objective of the present invention is to provide a display apparatus which comprises a display array, a diode element, and a set of transistors. The diode element comprises a first contact and a second contact. The set of transistors comprises a first contact, a second contact, and a third contact. The first contact of the set of transistors is connected to the display array. The second contact of the set of transistors receives a test signal to test the display array. The third contact of the set of transistors is connected to the first contact of the diode element. The second contact of the diode element receives an enable signal to activate the diode element and the set of transistors.

The circuit of the present invention may connect the input test signals to a circuit under test. For example, the circuit may connect the test signals to a display array of the flat panel display, and the test signals may be input to the display array via the circuit of the present invention for the test to proceed when the potential of the enable signal received by the circuit of the present invention reaches a level sufficient for activating the test on the display array. In normal operation of the display array, the circuit of the present invention does not function. Therefore, the conventional cutoff procedure that cuts off the electrical connections between the display array and the test signal input terminals may be omitted, and then the time and cost required for the production of the flat panel display may be decreased.

Other aspect, features, and advantages of the present invention become apparent from the following detailed descriptions, as well as the accompanying drawings of the preferred embodiments.

DESCRIPTION OF THE PREFERRED EMBODIMENT

Figure 1:
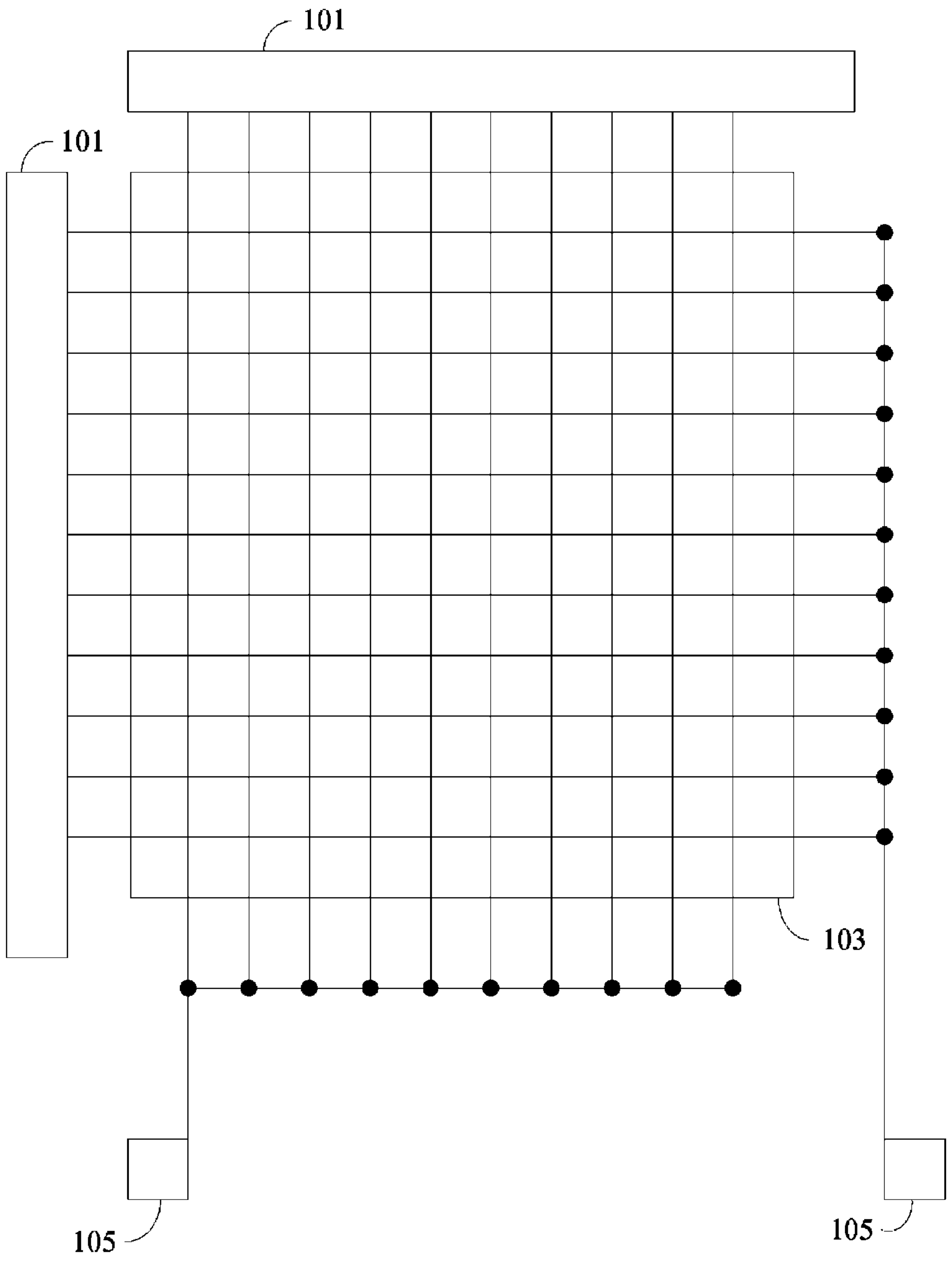
FIG. 1 (Prior Art)
FIG. 1 is a schematic diagram illustrating a test of the prior art on a flat panel display.
Figure 2:
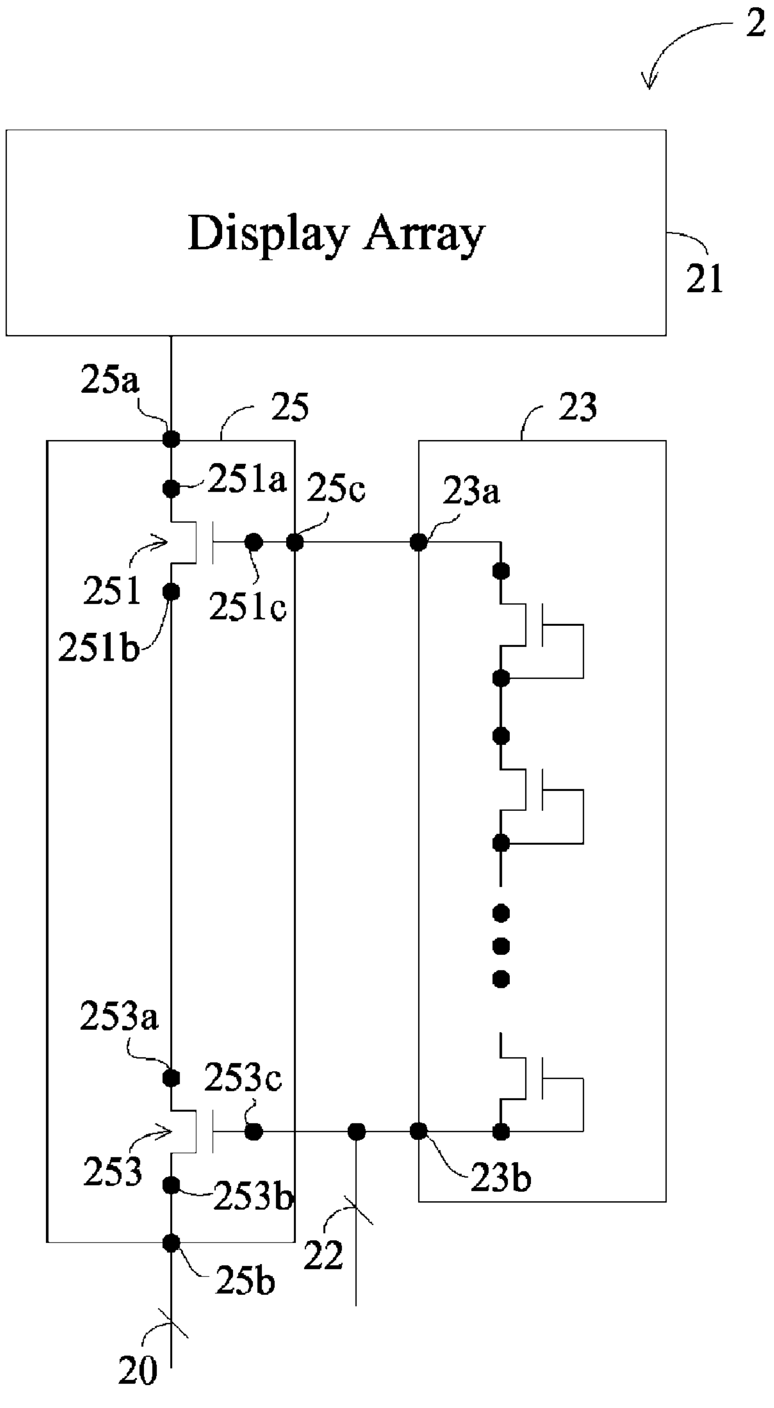
FIG. 2 is a circuit diagram illustrating a first embodiment of the present invention.

A first embodiment of the present invention, as shown in FIG. 2, is an organic electro-luminescence device (OELD) array display apparatus 2 that comprises a display array 21 and an enable circuit. Moreover, the OELD is namely organic light source. The OELD includes, for example, an organic small molecule material, an organic polymer molecule material, or combinations thereof. The enable circuit comprises a diode element 23 and a set of transistors 25 for activating the test for the circuit under test, i.e., the display array 21 according to an enable signal 22. Each pixel in the display array 21 requires one enable circuit for test. The diode element 23 is a single diode or comprises several serial diodes. As FIG. 2 shows, the diode element 23 comprises a first contact 23*a*, and a second contact 23*b*. The set of transistors 25 comprises a first contact 25*a*, a second contact 25*b*, a third contact 25*c*, a first transistor 251, and a second transistor 253. The first transistor 251 comprises a gate 251*c*, a first electrode 251*a*, and a second electrode 251*b*. The diode element 23 includes, for example, an organic material, inorganic material, combinations thereof. In present embodiment of the invention, the first electrode 251*a* is a drain, and the second electrode 251*b* is a source. The second transistor 253 comprises a gate 253*c*, a first node 253*a*, and a second node 253*b*. In the present embodiment of the invention, the first node 253*a* is a drain, and the second node 253*b* is a source. Although the present embodiment of the invention is exemplified with N-type transistors, P-type transistors, or combinations thereof may be applied as well. Moreover, the present invention is not limited to the materials and the kinds for transistors. For example, the materials such as amorphous Si, polycrystalline Si, microcrystalline Si, monocrystalline Si, or combinations thereof, and the kinds of transistors such as bottom-gate, top-gate, or the like are available. The connection relation of all the elements is described as follows.

The first contact 25*a* of the set of transistors 25 is connected to the display array 21. The second contact 25*b* of the set of transistors 25 receives a test signal 20 to test the display array 21. The third contact 25*c* of the set of transistors 25 is connected to the first contact 23*a* of the diode element 23. The second contact 23*b* of the diode element 23 receives the enable signal 22 to activate the enable circuit. The first electrode 251*a* of the first transistor 251 is connected to the first contact 25*a* of the set of transistors 25. More particularly, the first electrode 251*a* is connected to a certain pixel of the display array 21. The second electrode 251*b* of the first transistor 251 is connected to the first node 253*a* of the second transistor 253. The gate 251*c* of the first transistor 251 is connected to the third contact 25*c* of the set of transistors 25; that is, connected to the first contact 23*a* of the diode element 23. The second node 253*b* of the second transistor 253 is connected to the second contact 25*b* of the set of transistors 25. The gate 253*c* of the second transistor 253 receives the enable signal 22.

The diode element 23 consists of at least one diode, and the present invention is not limited to the number of the diodes. In other words, the diode element 23 may be one single diode only. In the present embodiment of the invention, the diodes in the diode element 23 are realized with transistors connected in a diode mode. That is, the substantially identical functions of diodes are fulfilled in a way that the gate of the transistor connected in a diode mode is connected to the drain of the same transistor.

To activate the enable circuit, the voltage level of the enable signal 22 is substantially greater than or substantially equal to $V_{th}+(V_D \times n)$, where $V_{th}$ is a threshold voltage of the first transistor 251, $V_D$ is a forward bias of one single diode of the diode element 23, and n is the number of the diodes in the diode element 23 and n is a positive integer. In other words, only if the voltage level of the enable signal 22 is greater than the sum of the threshold voltage of the first transistor 251 and the total forward bias voltage of all the diodes in the diode element 23, then the first transistor 251 and the second transistor 253 may be turned on simultaneously so that the test signal 20 may be input to the display array 21 for the purpose of test.

Figure 3:
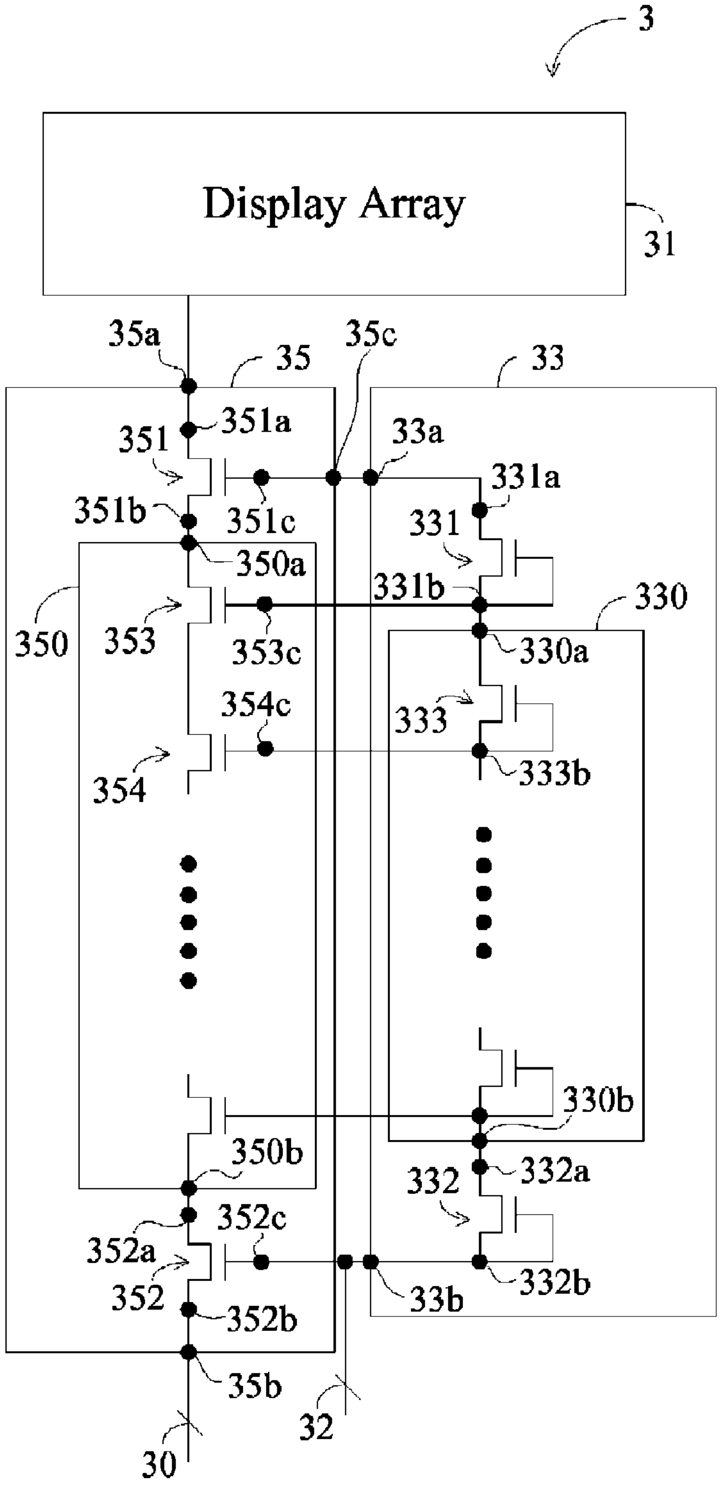
FIG. 3 is a circuit diagram illustrating a second embodiment of the present invention.

A second embodiment of the present invention, as shown in FIG. 3, is a liquid crystal pixel array display apparatus 3 that comprises a display array 31 and an enable circuit. The liquid crystal pixel array display apparatus includes all kinds of the liquid crystal pixel array design, such as multi-domain alignment (MVA) type, polymer self-aligned (PSA) type, in-plane switched (IPS) type, twisted nematic (TN) type, super twisted nematic (STN) type, advance super view (ASV) type, vertical alignment (VA) type, patterned vertical alignment (PVA) type, optical compensated birefringence (OCB) type, or likes. The enable circuit comprises a diode element 33 and a set of transistors 35 for activating a test on the display array 31 according to an enable signal 32. Each pixel in the display array 31 requires one enable circuit for test. The diode element 33 comprises a first contact 33*a*, a second contact 33*b*, a first diode 331, a second diode 332, and a subset of diodes 330. The set of transistors 35 comprises a first contact 35*a*, a second contact 35*b*, a third contact 35*c*, a first transistor 351, a second transistor 352, and a subset of transistors 350. The diode element 33 is also realized with diode-connected transistors. The first diode 331 comprises a first electrode 331*a* and a second electrode 331*b*. The second diode 332 comprises a first node 332*a* and a second node 332*b*. The subset of diodes 330 comprises a first terminal 330*a* and a second terminal 330*b*. The first transistor 351 comprises a gate 351*c*, a first electrode 351*a*, and a second electrode 351*b*, wherein the first electrode 351*a* is a drain, and the second electrode 351*b* is a source. The second transistor 352 comprises a gate 352*c*, a first node 352*a*, and a second node 352*b*, wherein the first node 352*a* is a drain, and the second node 352*b* is a source. The subset of transistors 350 comprises a first terminal 350*a* and a second terminal 350*b*. Similarly, although the second embodiment is exemplified with N-type transistors, P-type transistors may be applied as well. The connection relation of all the elements is described as follows.

The first contact 35*a* of the set of transistors 35 is connected to the display array 31. The second contact 35*b* of the set of transistors 35 receives a test signal 30 to test the display array 31. The third contact 35*c* of the set of transistors 35 is connected to the first contact 33*a* of the diode element 33. The second contact 33*b* of the diode element 33 receives the enable signal 32 to activate the enable circuit.

The first electrode 351*a* of the first transistor 351 is connected to the first contact 35*a* of the set of transistors 35; in other words, connected to the display array 31. The gate 351*c* of the first transistor 351 is connected to the third contact 35*c* of the set of transistors 35; that is, connected to the first contact 33*a* of the diode element 33. The first terminal 350*a* of the subset of transistors 350 is connected to the second electrode 351*b* of the first transistor 351. The first node 352*a* of the second transistor 352 is connected to the second terminal 350*b* of the subset of transistors 350. The second node 352*b* of the second transistor 352 is connected to the second contact 35*b* of the set of transistors 35. The gate 352*c* of the second transistor 352 receives the enable signal 32.

The first electrode 331*a* of the first diode 331 is connected to the first contact 33*a* of the diode element 33. The first terminal 330*a* of the subset of diodes 330 is connected to the second electrode 331*b* of the first diode 331. The first node 332*a* of the second diode 332 is connected to the second terminal 330*b* of the subset of diodes 330. The second node 332*b* of the second diode 332 is connected to the second contact 33*b* of the diode element 33.

The subset of transistors 350 comprises at least one serial transistor, and each serial transistor comprises a gate. The subset of diodes 330 comprises at least one serial diode, and each serial diode comprises a second electrode. Each of the gates of the serial transistors is connected to the second electrode of the corresponding serial diode. As shown in FIG. 3, the gate 353*c* of the first serial transistor 353 of the subset of transistors 350 is connected to the second electrode 331*b* of the first diode 331. The gate 354*e* of the second serial transistor 354 of the subset of transistors 350 is connected to the second electrode 333*b* of the first serial diode 333 of the subset of diodes 330, and so on.

To activate the enable circuit, the formula stated in the first embodiment determines the voltage level of the enable signal 32, and it is unnecessary to give any more details.

Based on the above-mentioned, one can know that, in order to test a display array, the voltage level of an enable signal has to be adjusted to a level sufficient for activating the enable circuit. In such a case, the test signal is thereupon input to the display array via a set of transistors to test the display array. In normal operation of the display apparatus, the enable signal would not be input any more. The diode element of the present invention makes the enable circuit out of function. Therefore, the normal operation of the display apparatus is unlikely be influenced so that the enable circuit need not be cut off. By using the present invention, the conventional cut-off procedure after test a display apparatus is no longer necessary. The time and cost required for the production of the flat panel display is saved thereby.

Thus, although the present invention has been described with respect to one or more embodiments thereof, it will be understood by those skilled in the art that the foregoing and various other changes, modifications, replacements, omissions, and deviations in the form and detail thereof may be made without departing from the scope of the present invention.

What is claimed is:

1. An enable circuit responsive to an enable signal to test a circuit of a display array, comprising:

a diode element comprising a first contact and a second contact; and a set of transistors comprising a first contact, a second contact, and a third contact;

wherein the first contact of the set of transistors is connected to the circuit, the second contact of the set of transistors receives a test signal to test the circuit, the third contact of the set of transistors is connected to the first contact of the diode element, and the second contact of the diode element receives the enable signal.

2. The enable circuit of claim 1, wherein the set of transistors comprises:

a first transistor comprising a first electrode, a second electrode, and a gate, wherein the first electrode of the first transistor is connected to the first contact of the set of transistors, and the gate of the first transistor is connected to the third contact of the set of transistors; and a second transistor comprising a first node, a second node, and a gate, wherein the first node of the second transistor is connected to the second electrode of the first transistor, the second node of the second transistor is connected to the second contact of the set of transistors, and the gate of the second transistor receives the enable signal.

3. The enable circuit of claim 2, wherein the voltage level of the enable signal is substantially greater than or substantially equal to $V_{th}+(V_D \times n)$ when the enable circuit is to be activated, where $V_{th}$ is a threshold voltage of the first transistor, $V_D$ is a forward bias of one single diode of the diode element, and n is the number of the diodes in the diode element.

4. The enable circuit of claim 1, wherein the diode element comprises one single diode.

5. The enable circuit of claim 1, wherein the diode element comprises a plurality of diodes in series.

6. The enable circuit of claim 1, wherein the set of transistors comprises:

a first transistor comprising a first electrode, a second electrode, and a gate, wherein the first electrode of the first transistor is connected to the first contact of the set of transistors, and the gate of the first transistor is connected to the third contact of the set of transistors;

a subset of transistors comprising a first terminal and a second terminal, wherein the first terminal of the subset of transistors is connected to the second electrode of the first transistor; and a second transistor comprising a first node, a second node, and a gate, wherein the first node of the second transistor is connected to the second terminal of the subset of transistors, the second node of the second transistor is connected to the second contact of the set of transistors, and the gate of the second transistor receives the enable signal.

7. The enable circuit of claim 6, wherein the diode element comprises:

a first diode comprising a first electrode and a second electrode, wherein the first electrode of the first diode is connected to the first contact of the diode element;

a subset of diodes comprising a first terminal and a second terminal, wherein the first terminal of the subset of diodes is connected to the second electrode of the first diode; and a second diode comprising a first node and a second node, wherein the first node of the second diode is connected to the second terminal of the subset of diodes, and the second node of the second diode is connected to the second contact of the diode element.

8. The enable circuit of claim 7, wherein the subset of transistors comprises a plurality of serial transistors, each serial transistor comprises a gate, the subset of diodes having a plurality of serial diodes, each serial diode comprises a second electrode, and the gate of at least one of the serial transistors is connected to the second electrode of the corresponding serial diode.

9. The enable circuit of claim 6, wherein the voltage level of the enable signal is substantially greater than or substantially equal to $V_{th}+(V_D \times n)$ when the enable circuit is to be activated, where $V_{th}$ is a threshold voltage of the first transistor, $V_D$ is a forward bias of one single diode of the diode element, and n is the number of the diodes in the diode element.

10. The enable circuit of claim 1, wherein the diode element comprises a transistor connected in a diode mode.

11. The enable circuit of claim 1, wherein the transistors in the set of transistors are N-type.

12. The enable circuit of claim 1, wherein the transistors in the set of transistors are P-type.

13. The enable circuit of claim 1, wherein the circuit comprises an organic electro-luminescence device array.

14. The enable circuit of claim 1, wherein the circuit comprises a liquid crystal pixel array.

15. A display apparatus, comprising:

a display array;

a diode element comprising a first contact and a second contact; and a set of transistors comprising a first contact, a second contact, and a third contact;

wherein the first contact of the set of transistors is connected to the display array, the second contact of the set of transistors receives a test signal to test the display array, the third contact of the set of transistors is connected to the first contact of the diode element, and the second contact of the diode element receives an enable signal to activate the diode element and the set of transistors.

16. The display apparatus of claim 15, wherein the set of transistors comprises:

a first transistor comprising a first electrode, a second electrode, and a gate, wherein the first electrode of the first transistor is connected to the first contact of the set of transistors, and the gate of the first transistor is connected to the third contact of the set of transistors; and a second transistor comprising a first node, a second node, and a gate, wherein the first node of the second transistor is connected to the second electrode of the first transistor, the second node of the second transistor is connected to the second contact of the set of transistors, and the gate of the second transistor receives the enable signal.

17. The display apparatus of claim 16, wherein the voltage level of the enable signal is substantially greater than or substantially equal to $V_{th}+(V_D \times n)$ when the enable circuit is to be activated, where $V_{th}$ is a threshold voltage of the first transistor, $V_D$ is a forward bias of one single diode of the diode element, and n is the number of the diodes in the diode element.

18. The display apparatus of claim 15, wherein the diode element comprises one single diode.

19. The display apparatus of claim 15, wherein the diode element comprises a plurality of diodes in series.

20. The display apparatus of claim 15, wherein the set of transistors comprises:

a first transistor comprising a first electrode, a second electrode, and a gate, wherein the first electrode of the first transistor is connected to the first contact of the set of transistors, and the gate of the first transistor is connected to the third contact of the set of transistors;

a subset of transistors comprising a first terminal and a second terminal, wherein the first terminal of the subset of transistors is connected to the second electrode of the first transistor; and a second transistor comprising a first node, a second node, and a gate, wherein the first node of the second transistor is connected to the second terminal of the subset of transistors, the second node of the second transistor is connected to the second contact of the set of transistors, and the gate of the second transistor receives the enable signal.

21. The display apparatus of claim 20, wherein the diode element comprises:

a first diode comprising a first electrode and a second electrode, wherein the first electrode of the first diode is connected to the first contact of the diode element;

a subset of diodes comprising a first terminal and a second terminal, wherein the first terminal of the subset of diodes is connected to the second electrode of the first diode; and a second diode comprising a first node and a second node, wherein the first node of the second diode is connected to the second terminal of the subset of diodes, the second node of the second diode is connected to the second contact of the diode element.

22. The display apparatus of claim 21, wherein the subset of transistors comprises a plurality of serial transistors, each serial transistor comprises a gate, the subset of diodes having a plurality of serial diodes, each serial diode comprises a second electrode, and the gate of at least one of the serial transistors is connected to the second electrode of the corresponding serial diode.

23. The display apparatus of claim 20, wherein the voltage level of the enable signal is substantially greater than or substantially equal to $V_{th}+(V_D \times n)$ when the enable circuit is to be activated, where $V_{th}$ is a threshold voltage of the first transistor, $V_D$ is a forward bias of one single diode of the diode element, and n is the number of the diodes in the diode element.

24. The display apparatus of claim 15, wherein the diode element comprises a transistor connected in a diode mode.

25. The display apparatus of claim 15, wherein the transistors in the set of transistors are N-type.

26. The display apparatus of claim 15, wherein the transistors in the set of transistors are P-type.

27. The display apparatus of claim 15, wherein the display array comprises an electro-luminescence device array.

28. The display apparatus of claim 15, wherein the display array comprises a liquid crystal pixel array.

* * * * *